US008866215B2

(12) United States Patent
Pfirsch

(10) Patent No.: US 8,866,215 B2
(45) Date of Patent: Oct. 21, 2014

(54) SEMICONDUCTOR COMPONENT HAVING A TRANSITION REGION

(75) Inventor: Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 1461 days.

(21) Appl. No.: 11/866,016

(22) Filed: Oct. 2, 2007

(65) Prior Publication Data

US 2008/0087952 A1    Apr. 17, 2008

(30) Foreign Application Priority Data

Oct. 2, 2006 (DE) .................. 10 2006 046 853

(51) Int. Cl.
| | |
|---|---|
| H01L 29/76 | (2006.01) |
| H01L 29/423 | (2006.01) |
| H01L 29/10 | (2006.01) |
| H01L 29/78 | (2006.01) |
| H01L 29/739 | (2006.01) |
| H01L 29/40 | (2006.01) |
| H01L 29/06 | (2006.01) |
| H01L 29/417 | (2006.01) |

(52) U.S. Cl.
CPC .......... *H01L 29/407* (2013.01); *H01L 29/402* (2013.01); *H01L 29/4236* (2013.01); *H01L 29/0615* (2013.01); *H01L 29/41741* (2013.01); *H01L 29/1095* (2013.01); *H01L 29/0696* (2013.01); *H01L 29/7811* (2013.01); *H01L 29/41766* (2013.01); *H01L 29/7813* (2013.01); *H01L 29/0619* (2013.01); *H01L 29/7397* (2013.01)
USPC ............................ 257/330; 257/329; 438/270

(58) Field of Classification Search
USPC ......... 257/262, 288, 327–335, 341, 342, 479, 257/499, E29.183; 438/270, 259, 271, 589
See application file for complete search history.

(56) References Cited

U.S. PATENT DOCUMENTS

| | | | | |
|---|---|---|---|---|
| 2004/0217416 | A1* | 11/2004 | Hsieh et al. | ................ 257/329 |
| 2004/0262677 | A1 | 12/2004 | Harada | |
| 2006/0043480 | A1 | 3/2006 | Tsuchitani et al. | |
| 2006/0231917 | A1* | 10/2006 | Ono et al. | ................ 257/500 |

FOREIGN PATENT DOCUMENTS

| | | |
|---|---|---|
| DE | 10127885 | 12/2002 |
| DE | 102004052678 | 6/2006 |
| EP | 1699083 | 9/2006 |
| WO | 2006046388 | 5/2006 |

* cited by examiner

*Primary Examiner* — Cuong Q Nguyen
(74) *Attorney, Agent, or Firm* — Dicke, Billig & Czaja, PLLC

(57) ABSTRACT

A semiconductor component is disclosed. One embodiment provides a semiconductor component including a semiconductor body having a cell array region with trenches and an edge region with pn junction. A transition region with at least one trench is formed between the cell array region and the edge region.

24 Claims, 11 Drawing Sheets

SEMICONDUCTOR COMPONENT HAVING A TRANSITION REGION

CROSS-REFERENCE TO RELATED APPLICATIONS

This Utility Patent Application claims priority to German Patent Application No. DE 10 2006 046 853.8 filed on Oct. 2, 2006, which is incorporated herein by reference.

BACKGROUND

The description relates to a semiconductor component, including an edge construction for a semiconductor component.

In semiconductor components such as, for instance, power transistors with trench cells, in the off-state case of the semiconductor component an electric field boosting occurs in the transition region from the cell array toward the edge construction. The edge construction serves for laterally reducing a reverse voltage. The curvatures of the equipotential lines which occur in this region in the off-state case entail increased field strengths, whereby the blocking capability of the component and the magnitude of an avalanche current flowing non-destructively at electrical breakdown can be limited. A semiconductor component whose edge construction enables an advantageous electric field profile with regard to the off state/breakdown state of the component would be desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
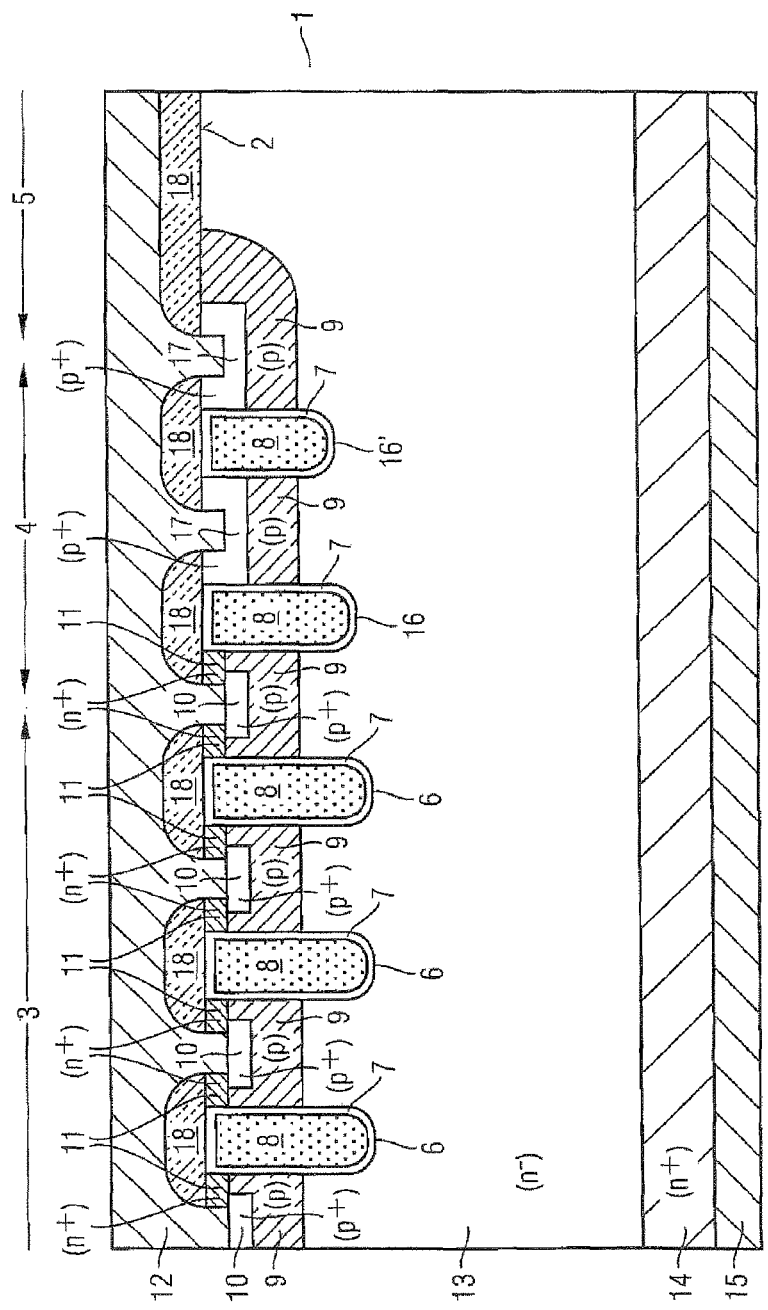
FIG. 1 illustrates a schematic cross-sectional view of a semiconductor component in accordance with one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment defines a semiconductor component including a semiconductor body having a cell array region with trenches and a body region and also an edge region with pn junction, wherein a transition region with at least one trench is formed between the cell array region and the edge region and a depth—relative to a surface of the semiconductor body—of the at least one trench in the transition region lies between the depth of the body region and the depth of a cell array trench in the cell array region and wherein a gate electrode is formed in the cell array trench and in at least one trench in the transition region.

By using the at least one trench in the transition region it is possible to reduce a curvature of the equipotential lines from the cell array region via the transition region to the edge region and hence to reduce an increase in the electric field strength.

Consequently, in the transition region, the depth of the trenches is adapted to the depth of the body region in one or more processes.

The semiconductor component can be for example, a gate controlled semiconductor component in the form of a power transistor such as a MOSFET (Metal Oxide Semiconductor Field Effect Transistor) or a DMOSFET (Double diffused MOSFET), an IGBT (Insulated Gate Bipolar Transistor) or a thyristor.

The pn junction in the edge region advantageously has at least one of the elements field plate, field ring, JTE structure (Junction Termination Extension Structure) and VLD structure (Variation of Lateral Doping Structure).

The semiconductor component can be contact-connected both via two opposite sides of the semiconductor body, e.g., a front side and a rear side, and via a side that is common to all the connections. In the latter case, a current can be led from the semiconductor component for example, via a buried conductive layer (a buried layer) laterally to a connection zone, which passes the current further to the surface of the semiconductor body. The connection zone can be embodied for example, in the form of a sinker or else a trench filled with conductive material.

A gate controlled semiconductor element in accordance with one embodiment can have both an inversion channel conductivity of the n type and an inversion channel conductivity of the p type. In the first-mentioned case, the semiconductor component can be formed for example, as an n-channel trench MOSFET with a body region of the p type and a source/drain region of the n type. In the second-mentioned case, the semiconductor component can be formed for example, as a p-channel trench MOSFET with a body region of the n type and a source/drain region of the p type.

The gate electrode has a conductive material, e.g., a metal or a doped semiconductor material. Doped polysilicon, for example, can serve as doped semiconductor material. The gate electrode in the cell array trench serves in particular for controlling the conductivity of an inversion channel in the adjacent mesa region. In the transition region, the gate electrode represents a reference potential with regard to the electric field reduction toward the edge region. Both in the cell array region and in the transition region, the gate electrodes are electrically insulated from the semiconductor body by using an insulation structure. In the cell array region, the insulation structure can have for instance a gate insulation layer and a comparatively thicker field insulation layer with respect thereto, and in the transition region, the insulation structure can be formed for example, as a field insulation layer.

In a further embodiment, the cell array trench projects deeper into the semiconductor body than the body region by a depth difference and the at least one trench in the transition region projects deeper into the semiconductor body than the body region in the cell array region by at most 70% of the depth difference.

In a semiconductor component in accordance with a further embodiment, the at least one trench in the transition region surrounds the cell array region. This results in particularly uniform configuration of an electric field profile from the cell array region to the edge region around the entire cell array. Further field boosting along the circumferential direction can thus be reduced or avoided.

In a further embodiment, a trench width of the plurality of trenches in the transition region is configured such that it decreases proceeding from the cell array region toward the edge region. A component of this type is particularly advantageous since the trenches in the cell array region and transition region can be produced jointly.

A further embodiment provides a semiconductor component in which at least one of the plurality of trenches in the transition region has a smaller depth than the body region in the cell array region.

An additional embodiment provides a semiconductor component in which a semiconductor region of the conductivity type of the body region is formed in the transition region. In an advantageous manner, the semiconductor region corresponds to the body region, that is to say that the body region extends into the transition region and defines the semiconductor region there. However, it is equally possible to form the semiconductor region independently of the body region as a separate semiconductor region, e.g., by using a different implantation than the body region.

A semiconductor component in accordance with a further embodiment has a further semiconductor region, which is formed within the semiconductor region in the transition region and which has a conductivity type corresponding to the semiconductor region and is doped comparatively more highly. The further semiconductor region is especially suitable as a contact connection zone on account of the comparatively higher doping. By way of example, the further semiconductor region can be contact-connected by using a metallic contact plug on the surface of the semiconductor body. The further semiconductor region can both adjoin the adjacent trench sidewalls and be remote from the latter.

A further embodiment specifies a semiconductor component in which trenches merge into one another from the cell array region to the transition region. Consequently, the trenches in the cell array region and transition region are connected to one another. As an alternative and/or supplementarily to this, the trenches in the cell array region and the trenches in the transition region can be locally separated from one another. In this case, the trenches in the two regions do not merge into one another. It is equally possible for a portion of the trenches in the transition region to merge into the trenches in the cell array region and for further trenches in the transition region to be positioned in a manner locally separated from the trenches in the cell array region.

In a further embodiment, a semiconductor zone of the conductivity type of the body region is formed within the edge region. The semiconductor zone serves to define the pn junction in the edge region. The semiconductor zone in the edge region advantageously corresponds to the body region. As a result, the body region in the cell array region, the semiconductor region in the transition region and the semiconductor zone in the edge region can be formed as a common semiconductor region. However, it is equally possible to form the semiconductor zone in the edge region independently of the body region. Equally, semiconductor zone in the edge region and semiconductor region in the transition region can constitute a common region different than the body region. A definition of body region in the cell array region, semiconductor region in the transition region and semiconductor zone in the edge region can be effected for example, taking account of the semiconductor wells present in the process sequence and also the field profiles that are to be obtained with them.

In a further embodiment, the trenches in the cell array are formed in strip-type, grid-type or ring- or cell-type fashion.

In a further embodiment, a gate electrode of the at least one trench in the transition region is connected to a potential of a gate electrode in the cell array region. As an alternative to this, the gate electrode of the at least one trench in the transition region can be connected to a potential of the source region in the cell array region. The gate electrode can equally be connected to a further predetermined potential, e.g., to a reference voltage.

In accordance with a further embodiment, a trench of the transition region which is closest adjacent to the cell array region has a depth corresponding to the depth of the cell array trench.

A further embodiment specifies a semiconductor component in which, with regard to at least one trench in the transition region, the source region only adjoins one sidewall. By way of example, the trench represents that trench in the transition region which is closest adjacent to the cell array.

In a further embodiment, source regions adjoining the trench sidewalls are present in the cell array region, whereas the source regions are absent with regard to at least one trench in the transition region.

In a further embodiment, the body region is that semiconductor region of the given conductivity type which projects the deepest into the semiconductor body. If the body region is formed for example, as a semiconductor well of the p type, then the well represents that region of the p type which projects the deepest into the semiconductor body. Independently of this, further semiconductor regions of the opposite conductivity type can be formed deeper within the semiconductor body. In the example mentioned, by way of example a buried semiconductor layer of the n type could be formed.

In one embodiment for producing a semiconductor component, firstly a semiconductor body is provided. This is followed by forming a cell array region, an edge region with pn junction and a transition region arranged between the edge region and the cell array region, wherein at least one trench is produced within the transition region, the depth—relative to a surface of the semiconductor body—of which at least one trench lies between the depth of a body region and the depth of a cell array trench in the cell array region, wherein a gate electrode is formed in the cell array trench and in at least one trench in the transition region.

In a further embodiment, the at least one trench in the transition region is formed jointly with the cell array trench. The trenches in the cell array and transition region can be produced by using a common etching step, for example.

With regard to jointly producing the trenches in the transition region and cell array region, it is advantageous to form the at least one trench in the transition region with a smaller trench width in comparison with the cell array trench. Thus, by way of example, the trenches in the transition region can be etched together with the trenches in the cell array region in such a way that narrower trenches are etched less deeply than wider trenches in the same time.

In a further embodiment, a plurality of trenches spaced apart laterally in the direction from the cell array region to the edge region are formed, the depth and width of which trenches decrease toward the edge region.

FIG. 1 illustrates a schematic cross-sectional view of a semiconductor component in accordance with one embodiment. The semiconductor component of this embodiment represents an n-channel trench MOSFET. A semiconductor body 1 is subdivided, relative to a surface 2 thereof, into a cell array region 3, a transition region 4 adjacent thereto, and also an edge region 5 adjacent to the transition region 4. Cell array trenches 6 are formed in the cell array region 3, the trenches projecting from the surface 2 into the semiconductor body 1. An insulation structure 7 adjoins an inner wall of the trenches 6 in the cell array region 3, the insulation structure electrically insulating a gate electrode 8 formed within the cell array trench 6 from the semiconductor body 1. For its part, the insulation structure 7 can be subdivided (not illustrated) for example, into a gate insulation structure and also a comparatively thicker field insulation structure with respect thereto. A body region 9 of the p type adjoining the surface 2 is formed in a mesa region between adjacent cell array trenches 6. Within the body region 9, a comparatively more highly doped further body connection region 10 is formed toward the surface 2 of the semiconductor body 1. Source regions 11 of the $n^+$ type are formed likewise toward the surface 2 of the semiconductor body 1 and in a manner adjoining the cell array trench 6. Both the source regions 11 and the body connection region 10 are contact-connected with a metal 12 via the surface 2 of the semiconductor body 1. For its part, the metal 12 can be formed for example, from a metallic contact plug and a metallization level (not illustrated). The body region 9 is vertically contact-connected via the metal 12 in the cell array region 3. The source regions 11 are laterally contact-connected by the metal 12. A respectively different contact-connection and positioning of body connection region 10 and source region 11 is equally possible.

A drift zone 13 of the $n^-$ type adjoins the body regions 9 and also the cell array trenches 6. The drift zone 13 can include for example, a semiconductor substrate with/without an epitaxial layer deposited thereon. A drain connection zone 14 of the $n^+$ conductivity type adjoins the drift zone 13. For its part, the drain connection zone 14 is contact-connected with a rear side metal 15 from the rear side of the semiconductor body 1. The rear side metal 15 forms a drain of the semiconductor component.

Two transition trenches 16, 16' are formed in the transition region 4 laterally adjoining the cell array region 3. The transition trenches 16, 16' have a depth relative to the surface 2 which decreases from the cell array region 3 toward the edge region 5, that is to say that the transition trench 16' formed closer to the edge region 5 has a smaller depth in comparison with the transition trench 16, which, for its part, in turn has a smaller depth than the cell array trenches 6. This counteracts an undesired great curvature of the equipotential lines from the cell array region 3 toward the edge region 5. As already within the cell array trenches 6, the insulation structure 7 is also formed on the inner walls of the transition trenches 16, 16', which electrically insulates the gate electrode 8 from the semiconductor body 1. It is pointed out that although the insulation structure 7 within the transition region 4 can correspond to the insulation structure 7 in the cell array region 3 or parts thereof, this is not absolutely necessary. The same applies to the gate electrode 8 in the transition region 4. Consequently, the insulation structure 7 in the transition region 4 can also be formed separately from that in the cell region 3. The body region 9 of the p type is also formed in the mesa region between the adjacent transition trenches 16, 16'. It should again be pointed out that the body region 9 in the transition region 4 can also be replaced by a semiconductor region of the p type which is different than the body region 9. A further semiconductor region 17 corresponding to the conductivity type of the body region 9 is formed within the body region 9 in the transition region 4, but the further semiconductor region has a comparatively higher dopant concentration in comparison with the body region 9. The further semiconductor region 17 in the transition region 4 preferably serves as a contact connection zone. The further semiconductor region 17 adjoins the adjacent transition trenches 16, 16' in the transition region 4, but this is not absolutely necessary. Consequently, the further semiconductor region 17 can also be positioned remote from the transition trenches 16, 16'.

As already in the transition region 4, the body region 9 and also the further semiconductor region 17 of the p type serving as a connection zone are also formed in the adjoining edge region 5. The drift zone 13 together with the body region 9 in the edge region 5 forms a pn junction serving in particular for the lateral voltage reduction of a reverse voltage. The further semiconductor region 17 can be formed jointly with the body connection region 10, that is to say that the further semiconductor region 17 and the body connection region 10 can correspond to one another, but this is not absolutely necessary. The body region 9 in the edge region 5 and also the further semiconductor region 17 embedded therein can also be formed by well zones which differ from those in the transition region 4 and/or cell array region 3. This depends, inter alia, on the technology on which the semiconductor component is based, in particular on the available number of suitable well zones and on the requirements made of the profile of the electric field in the transition region 4/edge region 5.

On the surface 2 of the semiconductor body 1, the metal 12 in the region that does not make contact with the mesa region is electrically insulated from the semiconductor body 1 by a further insulation structure 18.

The materials of this and also the further embodiments can be chosen diversely. By way of example, Si, Ge, SiGe, SiC or III-V compound semiconductors such as GaAs or else further ternary and quaternary semiconductor compounds can be used as semiconductor body 1. By way of example, oxides, nitrides or further dielectrics can be used as insulation structure 7, 18. If the semiconductor body 1 is formed from silicon, then in particular silicon dioxide $SiO_2$ and/or silicon nitride ($Si_3N_4$) is suitable as insulation structure.

Both a metallic and a semiconductor material can be used as material for the gate electrode 8. In the case of a semiconductor body 1 composed of silicon, in particular doped polysilicon is suitable as material for the gate electrode 8.

Both in this embodiment and in the embodiments explained further below, a connection of source and drain can also be effected via a common surface, e.g., the surface 2. In this case, for example, a buried conductive semiconductor layer (so-called buried layer) can be formed below the drift zone 13, and is led to the surface outside the cell array region 13 via a conductive connection zone (e.g., a sinker or a trench filled with conductive material). Although the semiconductor component illustrated in FIG. 1 has two transition trenches 16, 16', the component and also the embodiments of components that are explained further below can generally be formed with at least one trench in the transition region 4 which has a depth—relative to the surface 2—which lies between the depth of the body region and the depth of the cell array trench in the cell array region.

Figure 2:
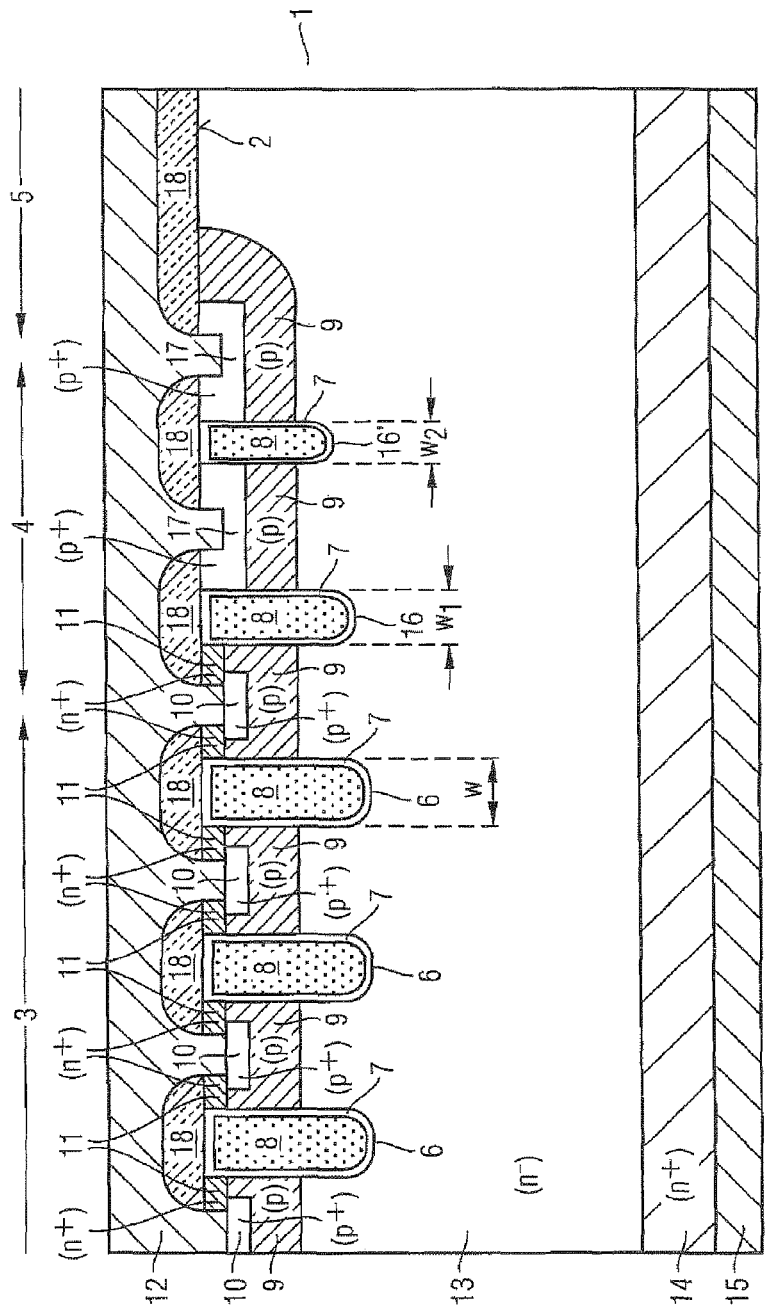
FIGS. 2-7 illustrate schematic cross-sectional views of semiconductor components in accordance with further embodiments.

FIG. 2 illustrates a schematic cross-sectional view of a semiconductor component in accordance with a further embodiment. Components corresponding to FIG. 1 are provided with the same reference symbols and not explained again below. In this connection, reference is made to the corresponding parts of the description concerning FIG. 1. The embodiment illustrated in FIG. 2 differs from the embodiment illustrated in FIG. 1 by virtue of the fact that the transition trenches 16, 16' in the transition region 4 are configured differently. Whereas in the first embodiment illustrated in FIG. 1 both the cell array trenches 6 and the transition trenches 16, 16' have a corresponding trench width, the trench width of the embodiment illustrated in FIG. 2 decreases in the transition region 4 from the cell array region 3 toward the edge region 5. If w corresponds to a trench width in the cell array region 3, $w_1$ corresponds to a trench width of the transition trench 16 closest adjacent to the outermost cell array trench 6, and $w_2$ corresponds to a trench width of a transition trench 16' formed even further toward the edge region 5, then $w > w_1 > w_2$ holds true. This embodiment has advantages in particular with regard to the production of the semiconductor component. Thus, the cell array trenches 6 can be formed together with the transition trenches 16, 16', that is to say in a common etching step, by choosing the etching in such a way that given a constant etching time, an etching takes place that is all the deeper, the wider an etching attack area of the trenches to be formed on the surface 2.

Figure 3:
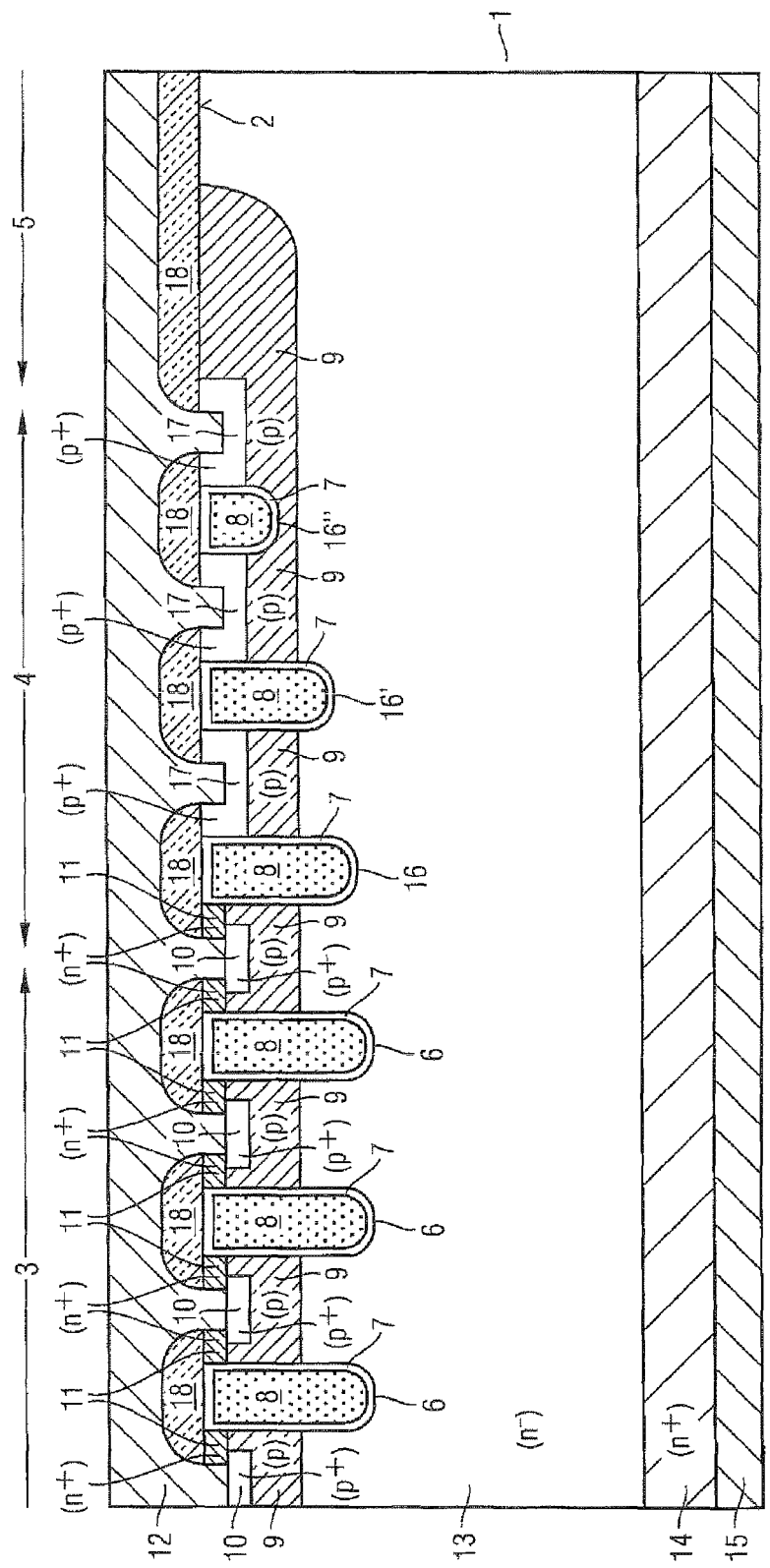

FIG. 3 illustrates a schematic cross-sectional view of a semiconductor component in accordance with a further embodiment. Components corresponding to the embodiments illustrated in FIGS. 1 and 2 are once again identified by the same reference symbols and not explained again. Instead, reference is made to the corresponding parts of the description concerning the figures. The embodiment illustrated in FIG. 3 differs from the embodiment illustrated in FIG. 1 by virtue of the fact that three transition trenches 16, 16' and 16" laterally adjacent to one another are provided in the transition region 4. In this case, the transition trench 16" lying furthest outward has a smaller depth than the body region 9.

Figure 4:
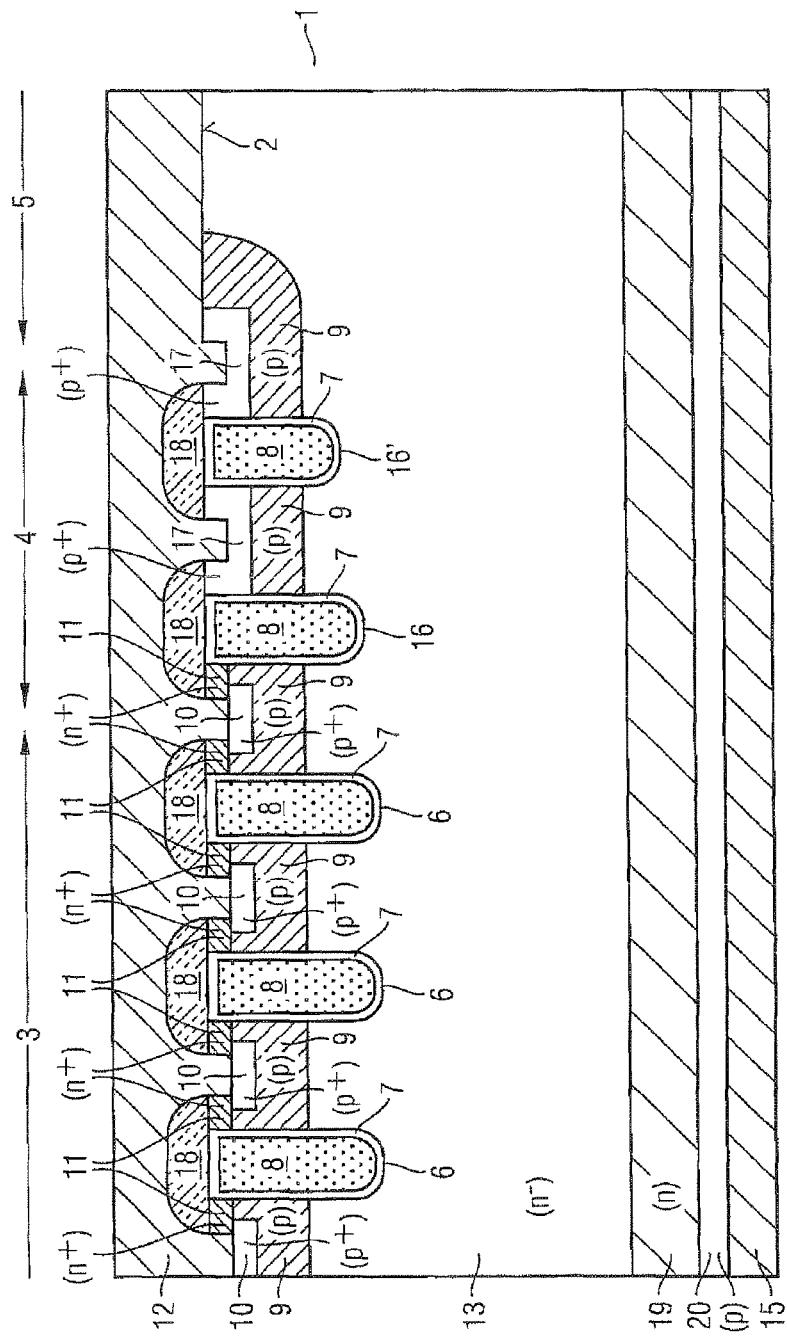

FIG. 4 illustrates a schematic cross-sectional view of a semiconductor component in accordance with a further embodiment. Components that have already been illustrated in the previous figures are once again identified by the same reference symbols and not explained again. Instead, reference should be made to the corresponding parts of the description concerning the figures. Although the embodiment illustrated in FIG. 4 does not differ from the embodiment illustrated in FIG. 1 with regard to the configuration of the cell array region 3, the transition region 4 and the edge region 5, it nevertheless represents a different semiconductor component than the semiconductor components illustrated in FIGS. 1-3. Whereas FIGS. 1-3 relate to n-channel MOSFETs, the semiconductor component illustrated in FIG. 4 corresponds to an IGBT. In this case, a semiconductor zone 19 of the n type adjoins below the drift zone 13, the semiconductor zone being doped more highly in comparison therewith. The semiconductor zone 19 can serve as a field stop zone, for example. A rear side emitter zone 20 of the p conductivity type is formed below the semiconductor zone 19. As already in the embodiments illustrated in FIGS. 1-3, a rear side metal 15 is formed on the rear side of the semiconductor body 1, the rear side metal here adjoining the rear side emitter zone 20.

Figure 5:
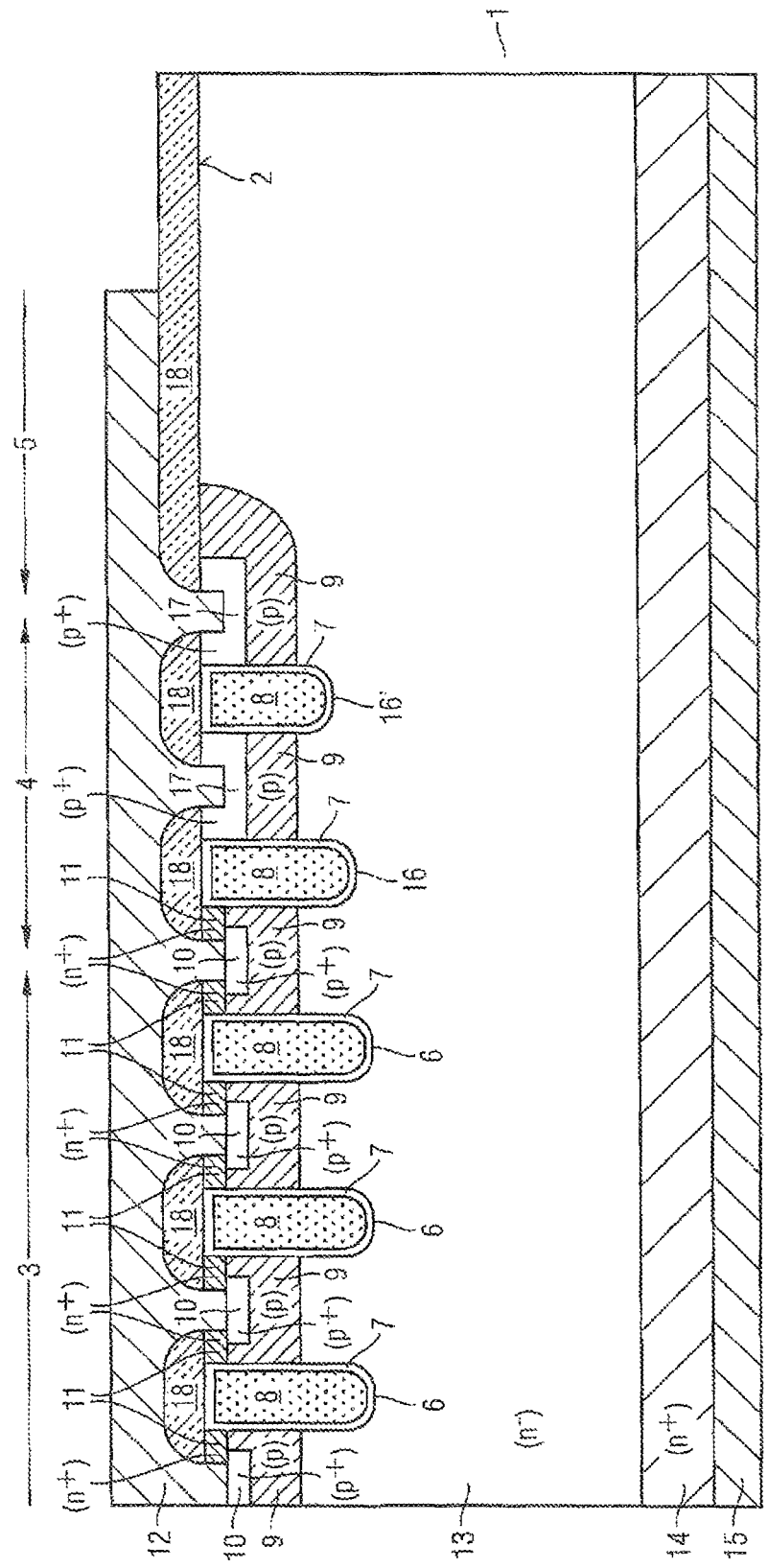

FIG. 5 illustrates a schematic cross-sectional view in accordance with a further embodiment. Components which have already been illustrated in the previous figures are once again identified by the same reference symbols and not explained again. Instead, reference should be made to the corresponding parts of the description concerning the figures. The embodiment illustrated in FIG. 5 differs from the embodiment illustrated in FIG. 1 by virtue of the fact that the metal 12 projects comparatively further into the edge region 5. The metal 12 in the edge region 5 thus serves as a field electrode for advantageously influencing the electric field profile.

Figure 6:
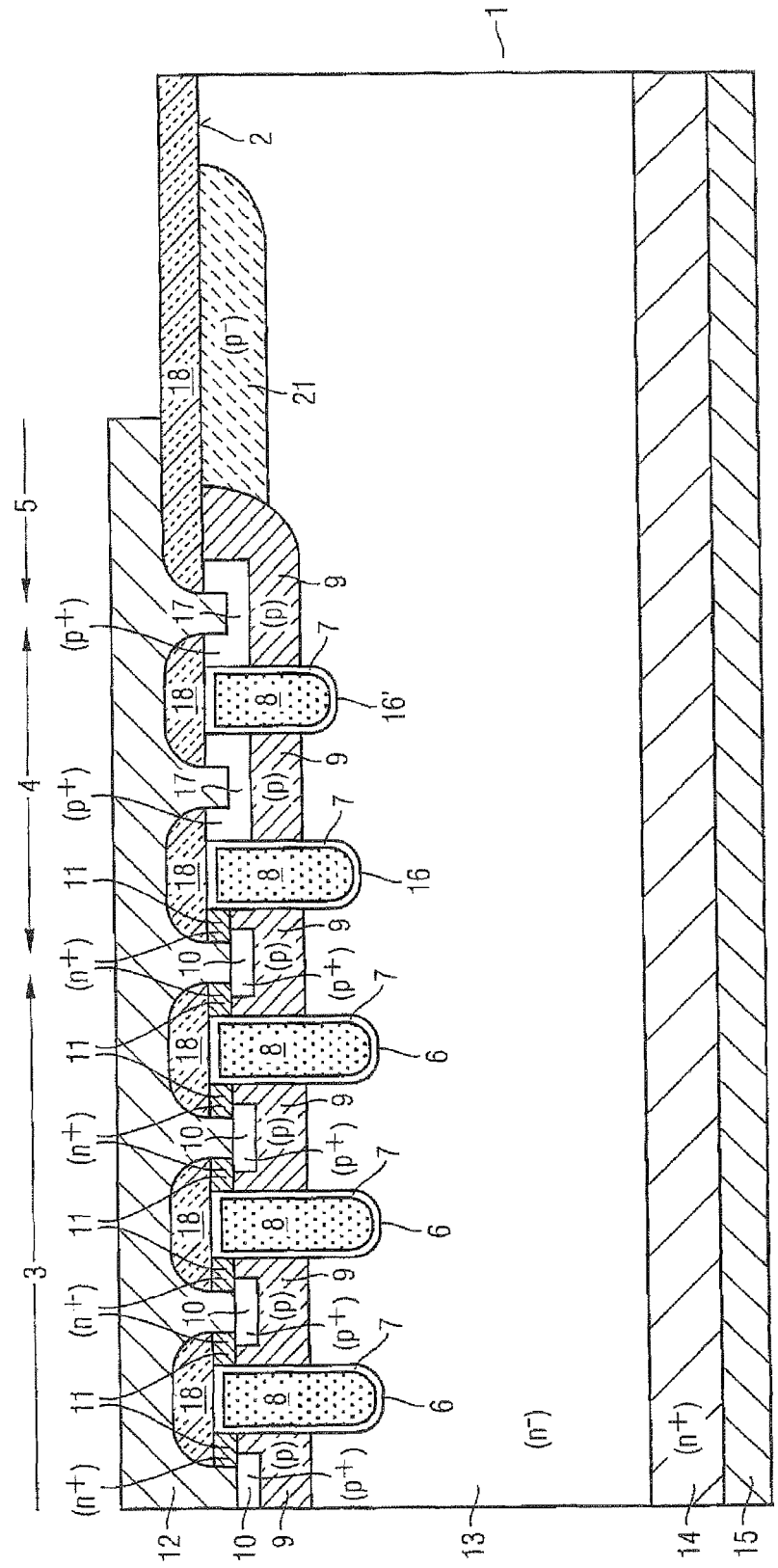

FIG. 6 illustrates a schematic cross-sectional view of a semiconductor component in accordance with a further embodiment. Components which have already been illustrated in FIGS. 1 and 2 are once again identified by the same reference symbols and not explained again. Instead, reference should be made to the corresponding parts of the description concerning the figures. The embodiment illustrated in FIG. 6 differs from the embodiment illustrated in FIG. 1 by virtue of the configuration of the edge region 5. In this embodiment, a well zone of the $p^-$ type adjoining the surface 2 is formed within the semiconductor body 1 in the edge region 5, and merges into the body region 9 toward the transition region 4. The well zone 21 is doped comparatively more lightly than the body region 9 and can be formed as a JTE structure (Junction Termination Extension Structure) or VLD structure (Variation of Lateral Doping Structure).

Figure 7:
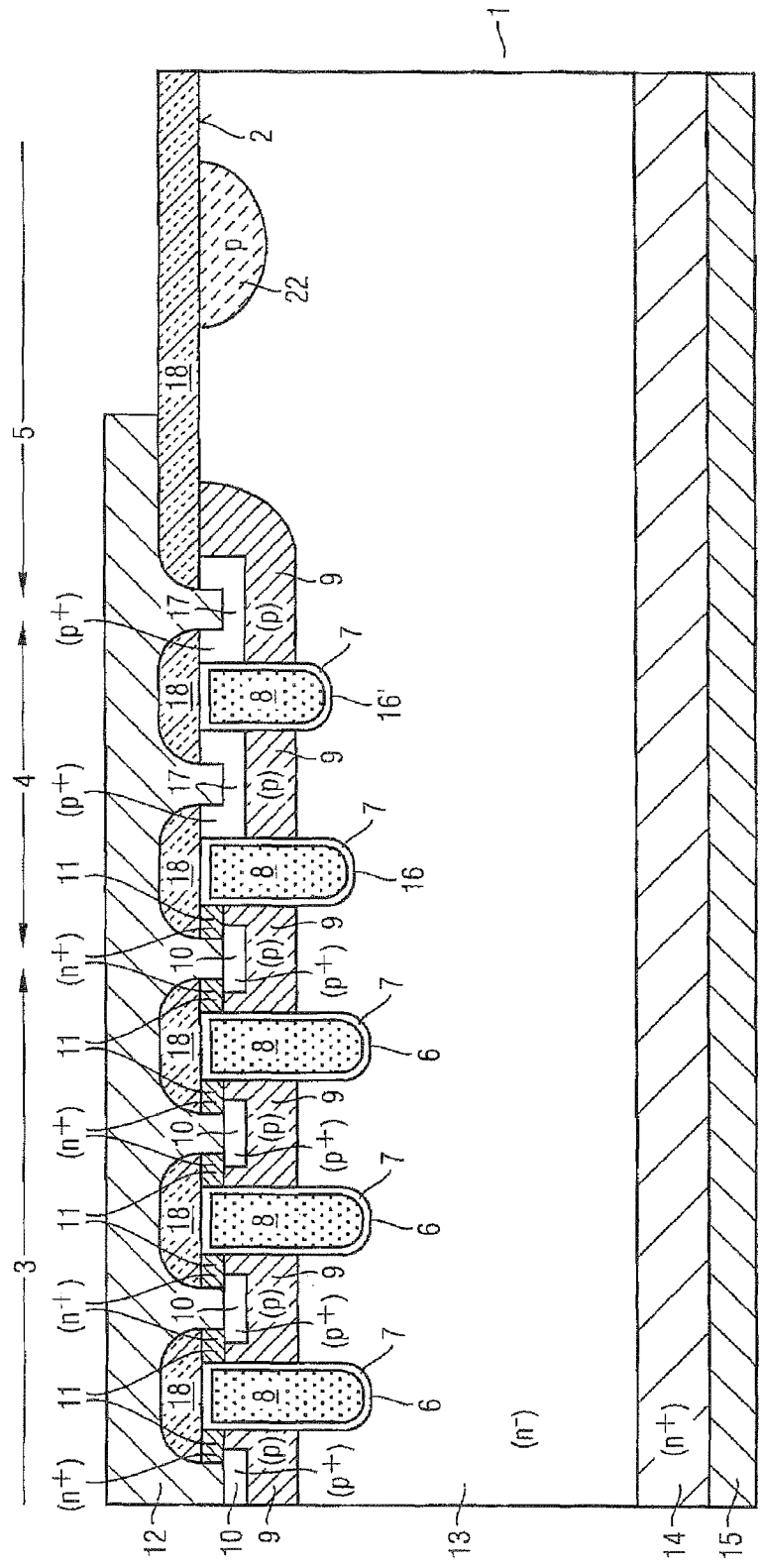

FIG. 7 illustrates a schematic cross-sectional view in accordance with a further embodiment. Components which have already been illustrated in the previous figures are once again identified by the same reference symbols and not explained again. Instead, reference should be made to the corresponding parts of the description concerning the figures. The embodiment illustrated in FIG. 7 differs from the embodiment illustrated in FIG. 1 by virtue of the configuration of the edge region 5. Thus, the embodiment illustrated in FIG. 7 has, within the semiconductor body 1 in the edge region 5, a field zone 22 of the p type reaching as far as the surface 2. The field zone 22 is formed in potential-free fashion, that is to say in floating fashion, and can be configured in ring-shaped fashion, for example, in a plan view of the semiconductor component. If a reverse voltage is applied to the semiconductor component, then the field zone 12 serves for reducing the electric field spikes in the edge region 5.

Figure 8:
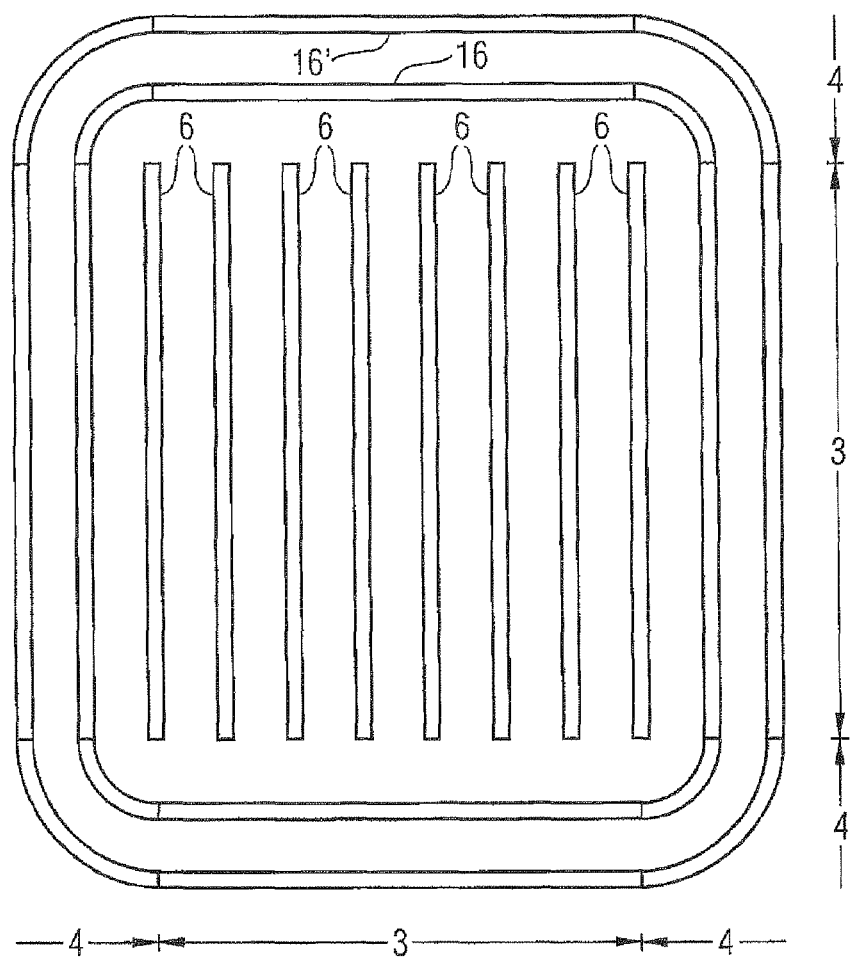
FIGS. 8-11 illustrate schematic plan views of embodiments.

FIG. 8 illustrates a schematic plan view of a semiconductor component in accordance with a further embodiment. In particular the configuration of the cell array trenches 6 and transition trenches 16, 16' is discussed in this case. Thus, in this embodiment, the cell array trenches 6 are formed parallel to one another and in strip-type fashion. In the transition region 4 surrounding the cell array region 3, the transition trenches 16, 16' are laterally adjacent to one another and enclose the cell array region 3. The plan view illustrated in FIG. 8 can be assigned for example, to the embodiments illustrated in FIGS. 1, 2, 4, 5, 6 and 7.

Figure 9:
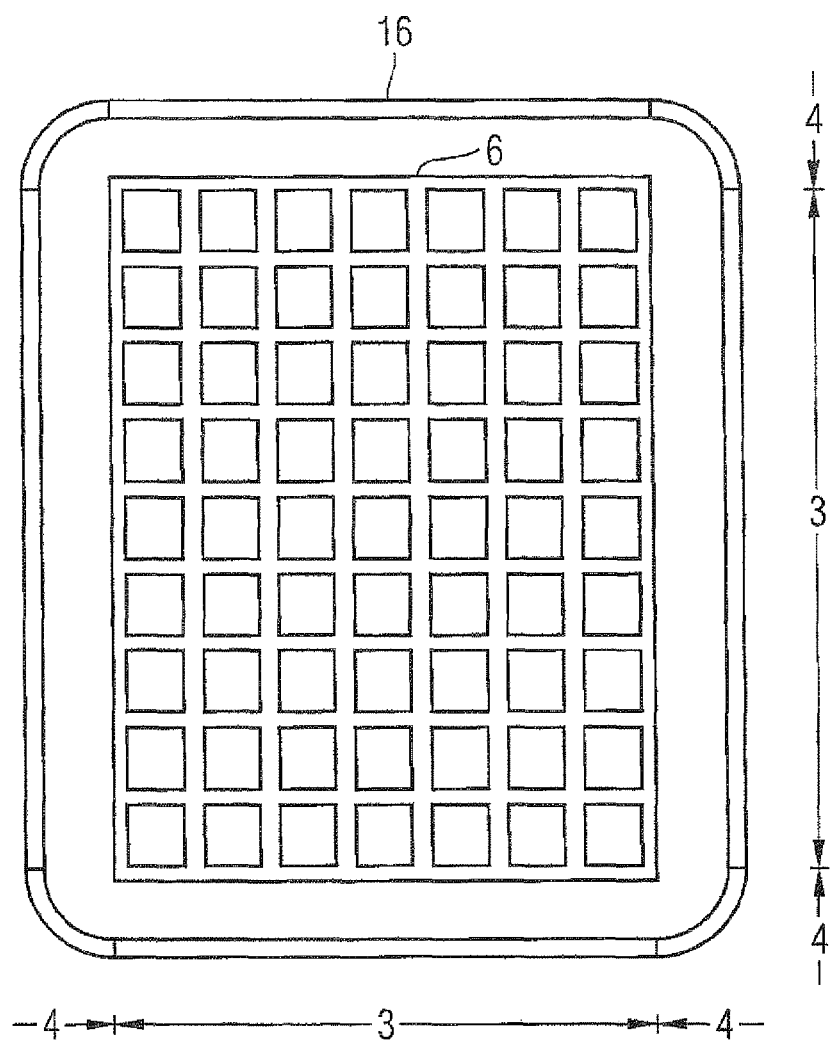

FIG. 9 illustrates a schematic plan view of a semiconductor component in accordance with a further embodiment. In this case, the cell array trench 6 in the cell array region 3 is configured in the form of a grid structure enclosed by a transition trench 16 in the transition region 4.

Figure 10:
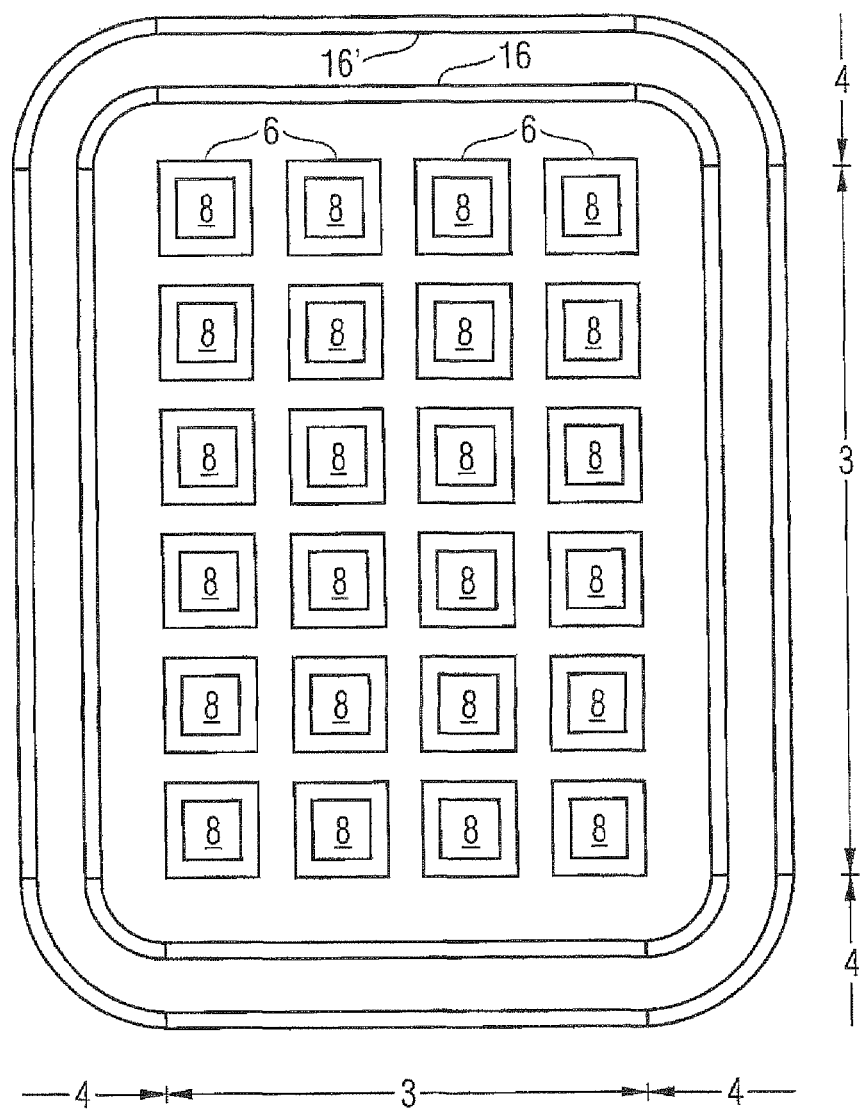

FIG. 10 illustrates a schematic plan view of a semiconductor component in accordance with a further embodiment. In contrast to the embodiment of FIG. 8, the cell array trenches 6 are not formed in strip-type fashion, but rather in cell-type fashion as closed cell array trenches.

Figure 11:
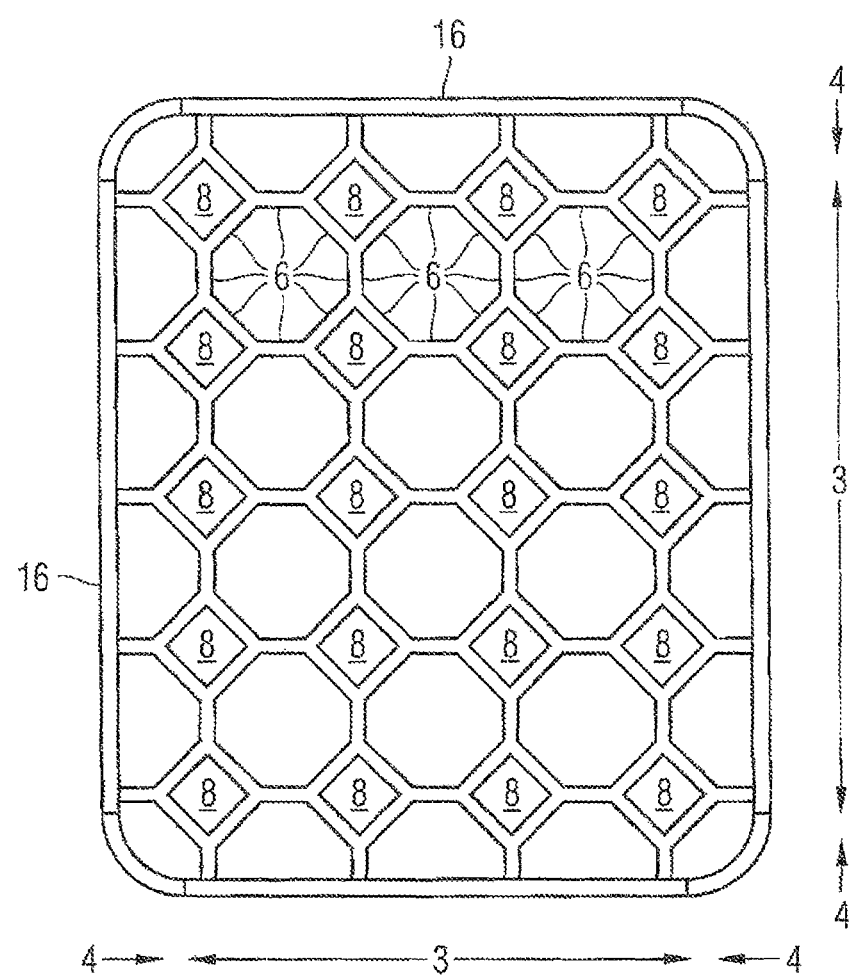

FIG. 11 illustrates a schematic plan view of a semiconductor component in accordance with a further embodiment. This differs from the plan views of the embodiments illustrated in FIGS. 8-10 in particular by virtue of the fact that the cell array trench 6 merges into the transition trench 16, that is to say that a connection between the trenches is present. Furthermore, the cell array region 3 in FIG. 11 is configured in such a way that the semiconductor component has a cell structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
    a semiconductor body having a cell array region with cell array trenches and a body region of a first conductivity type, the body region adjoining a drift zone of a second conductivity type which is opposite to the first conductivity type, an interface between the drift zone and the body region extending parallel to a surface of the semiconductor body in the cell array region;
    an edge region with pn junction and without trenches;
    a transition region with at least one trench, the transition region formed between the cell array region and the edge region; and
    wherein a gate electrode adjoining an insulating structure is formed in the cell array trenches and in each of the at least one trench in the transition region, respectively,
    the insulation structure being formed on sidewalls and a bottom wall of the at least one trench in the transition region,
    wherein in at least one trench in the transition region, a source region only adjoins the insulation structure on one sidewall of the at least one trench in the transition region,
    wherein a depth, relative to a surface of the semiconductor body, of the gate electrode adjoining the insulating structure in the at least one trench in the transition region lies between the depth of the body region and the depth of the gate electrode adjoining the insulating structure in the cell array trenches,
    wherein the cell array trenches project deeper into the semiconductor body than the body region by a depth difference, and
    wherein the gate electrode adjoining the insulating structure in at least one trench in the transition region projects deeper into the semiconductor body than the body region in the cell array region at most by 70% of the depth difference, and the gate electrodes in each of the at least one trench in the transition region are connected to a predetermined potential.

2. The semiconductor component of claim 1, comprising wherein the at least one trench surrounds the cell array region.

3. The semiconductor component of claim 1, comprising wherein the at least one trench in the transition region is in the form of a plurality of trenches spaced apart laterally in the direction from the cell array region to the edge region and the depth of which decreases toward the edge region.

4. The semiconductor component of claim 3, comprising wherein a trench width of the plurality of trenches in the transition region decreases from the cell array region toward the edge region.

5. The semiconductor component of claim 3, comprising wherein at least one of the plurality of trenches in the transition region has a smaller depth than the body region in the cell array region.

6. The semiconductor component of claim 3, comprising wherein a semiconductor region of the conductivity type of the body region is formed in the transition region.

7. The semiconductor component of claim 6, comprising wherein the semiconductor region corresponds to the body region.

8. The semiconductor component of claim 6, comprising wherein a further semiconductor region is formed within the semiconductor region in the transition region, and has a conductivity type corresponding to the semiconductor region and is doped comparatively more highly.

9. The semiconductor component of claim 1, comprising wherein trenches merge into one another from the cell array region to the transition region.

10. The semiconductor component of claim 1, comprising wherein trenches in the cell array region and trenches in the transition region are locally separated from one another.

11. The semiconductor component of claim 1, comprising wherein a semiconductor zone of the conductivity type of the body region is formed within the edge region.

12. The semiconductor component of claim 11, comprising wherein the semiconductor zone corresponds to the body region.

13. The semiconductor component of claim 1, comprising wherein the trenches in the cell array are formed in strip-type, grid-type or cell-type fashion.

14. The semiconductor component of claim 1, comprising wherein a gate electrode of the at least one trench in the transition region is connected to a potential of a gate electrode in the cell array region.

15. The semiconductor component of claim 1, comprising wherein a gate electrode of the at least one trench in the transition region is connected to a potential of a source region in the cell array region.

16. The semiconductor component of claim 1, comprising wherein a trench of the transition region which is closest adjacent to the cell array region has a depth corresponding to the depth of the cell array trench.

17. The semiconductor component of claim 1, comprising wherein the body region is that semiconductor region of the given conductivity type which projects the deepest into the semiconductor body.

18. The semiconductor device of claim 1, wherein at least one trench in the transition region having a smaller depth than the cell array trenches includes a source region only adjoining the insulating structure on one sidewall of the at least one trench.

19. A method for producing a semiconductor component comprising:
    providing a semiconductor body comprising a body region of a first conductivity type, the body region adjoining a drift zone of a second conductivity type which is opposite to the first conductivity type, an interface between the drift zone and the body region extending parallel to a surface of the semiconductor body in the cell array region;
    forming a cell array region, an edge region with pn junction and without trenches and a transition region arranged between the edge region and the cell array region, wherein at least one trench is produced within the transition region,
    forming a gate electrode and an insulating structure adjoining the gate electrode in a cell array trench and in each of the at least one trench in the transition region, respectively;

wherein in at least one trench in the transition region, a source region only adjoins the insulation structure on one sidewall of the at least one trench in the transition region, a depth, relative to a surface of the semiconductor body, of the gate electrode adjoining the insulating structure in at least one trench in the transition region lies between a depth of a body region and a depth of the gate electrode adjoining the insulating structure in the cell array trench in the cell array region; and wherein the gate electrodes in each of the at least one trench in the transition region are connected to a predetermined potential.

20. The method of claim 19, comprising forming the at least one trench in the transition region jointly with the cell array trench.

21. The method of claim 20, comprising forming the at least one trench in the transition region with a smaller trench width in comparison with the cell array region.

22. The method of claim 21, comprising embodying the at least one trench in the transition region in the form of a plurality of trenches spaced apart laterally in the direction from the cell array region to the edge region and the depth and width of which decrease toward the edge region.

23. The method of claim 19, wherein at least one trench in the transition region having a smaller depth than the cell array trenches includes a source region only adjoining the insulating structure on one sidewall of the at least one trench.

24. A semiconductor component comprising:

a semiconductor body having a cell array region with cell array trenches and a body region of a first conductivity type, the body region adjoining a drift zone of a second conductivity type which is opposite to the first conductivity type, an interface between the drift zone and the body region extending parallel to a surface of the semiconductor body in the cell array region;

an edge region with pn junction and without trenches;

a transition region with at least one trench, the transition region formed between the cell array region and the edge region; and wherein a gate electrode adjoining an insulating structure is formed in the cell array trenches and in each of the at least one trench in the transition region, respectively, the insulation structure being formed on sidewalls and a bottom wall of the at least one trench in the transition region, wherein a depth, relative to a surface of the semiconductor body, of the gate electrode adjoining the insulating structure in the at least one trench in the transition region lies between the depth of the body region and the depth of the gate electrode adjoining the insulating structure in the cell array trenches, wherein the cell array trenches project deeper into the semiconductor body than the body region by a depth difference, and wherein the gate electrode adjoining the insulating structure in at least one trench in the transition region projects deeper into the semiconductor body than the body region in the cell array region at most by 70% of the depth difference, and the gate electrodes in each of the at least one trench in the transition region are connected to a predetermined potential.

* * * * *